（12) United States Patent
Singh et al.

(10) Patent No.: US 11,967,635 B2
(45) Date of Patent: Apr. 23, 2024

(54) LATERAL BIPOLAR TRANSISTOR

(71) Applicant: GLOBALFOUNDRIES U.S. Inc., Malta, NY (US)

(72) Inventors: Jagar Singh, Clifton Park, NY (US); Randy L. Wolf, Essex Junction, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 31 days.

(21) Appl. No.: 17/533,805

(22) Filed: Nov. 23, 2021

(65) Prior Publication Data

US 2023/0061717 A1    Mar. 2, 2023

Related U.S. Application Data

(60) Provisional application No. 63/239,599, filed on Sep. 1, 2021.

(51) Int. Cl.
*H01L 29/735* (2006.01)
*H01L 29/06* (2006.01)
(Continued)

(52) U.S. Cl.
CPC ........ *H01L 29/735* (2013.01); *H01L 29/0646* (2013.01); *H01L 29/0649* (2013.01); *H01L 29/161* (2013.01); *H01L 29/6625* (2013.01)

(58) Field of Classification Search
CPC ............. H01L 29/0646; H01L 29/0649; H01L 29/161; H01L 29/6625; H01L 29/063; H01L 29/6656; H01L 29/0847; H01L 29/0673; H01L 29/775; H01L 29/66439; H01L 29/78696; H01L 29/42392; H01L 29/36; H01L 27/0623; H01L 27/0823; H01L 21/76897; H01L 21/823493; H01L 21/823475; H01L 21/823468; H01L 21/82285; H01L 21/823821; H01L 21/04; (Continued)

(56) References Cited

U.S. PATENT DOCUMENTS 6,940,149 B1      9/2005   Divakaruni et al.
6,972,466 B1 *  12/2005   Liang .................... H01L 29/735
                                                                257/376
(Continued)

FOREIGN PATENT DOCUMENTS

KR            1304051 B1 *   9/2013   ......... H01L 27/0928

OTHER PUBLICATIONS

Koo, Electrostatic discharge protection circuit, 2013, machine translation of KR-101304051 B1, pp. 1-6. (Year: 2013).*

*Primary Examiner* — Natalia A Gondarenko
(74) *Attorney, Agent, or Firm* — Francois Pagette; Andrew M. Calderon; Calderon Safran & Cole, P.C.

(57) ABSTRACT

The present disclosure relates to semiconductor structures and, more particularly, to a lateral bipolar transistor and methods of manufacture. The structure includes: an extrinsic base region within a semiconductor substrate material; a shallow trench isolation structure extending into the semiconductor substrate material and bounding the extrinsic base region; an emitter region adjacent to the shallow trench isolation structure and on a side of the extrinsic base region; and a collector region adjacent to the shallow trench isolation structure and on an opposing side of the extrinsic base region.

14 Claims, 5 Drawing Sheets

(51) Int. Cl.
*H01L 29/161* (2006.01)
*H01L 29/66* (2006.01)

(58) Field of Classification Search
CPC ............... H01L 21/331; H01L 21/8222; H01L 21/8229; H01L 21/8249; H01L 2924/1305; H01L 2924/13056; H01L 29/04; H01L 29/0804–0834; H01L 29/1004; H01L 29/1008; H01L 29/0696; H01L 29/41708; H01L 29/42304; H01L 27/0229–0244; H01L 27/0262; H01L 27/0263; H01L 27/082–0828; H01L 27/102; H01L 27/1022; H01L 27/11801; H01L 27/11896; H01L 27/2445; H01L 29/66234–66348; H01L 29/73–7378; H01L 29/739–7398
USPC ............... 257/273, 565, 586, 592, 557; 438/309–327
See application file for complete search history.

(56) References Cited

U.S. PATENT DOCUMENTS

| | | | |
|---|---|---|---|
| 7,897,995 B2 | 3/2011 | Yang et al. | |
| 7,932,166 B2 | 4/2011 | Frohberg et al. | |
| 8,288,758 B2 | 10/2012 | Ning et al. | |
| 8,420,493 B2 | 4/2013 | Ning et al. | |
| 8,669,640 B2 * | 3/2014 | Lin .................... | H01L 29/7322 438/335 |
| 9,252,233 B2 | 2/2016 | Hsiao et al. | |
| 2009/0166721 A1 * | 7/2009 | Denison ............. | H01L 27/0262 257/E27.015 |
| 2012/0098096 A1 * | 4/2012 | Lin .................... | H01L 21/8222 257/E29.174 |
| 2014/0138749 A1 * | 5/2014 | Huang ................ | H01L 27/0623 438/189 |
| 2015/0097265 A1 * | 4/2015 | Lin ..................... | H01L 29/735 438/335 |
| 2022/0045174 A1 * | 2/2022 | Suligoj ............... | H01L 29/401 |

* cited by examiner

LATERAL BIPOLAR TRANSISTOR

BACKGROUND

The present disclosure relates to semiconductor structures and, more particularly, to lateral bipolar transistors and methods of manufacture.

Bipolar transistors can be vertical transistors or lateral transistors. In a vertical bipolar transistor, carriers flow in a vertical direction. Since a collector region is formed in a position deep from a wafer surface, collector resistance increases, thus limiting the transistor performance especially for high-speed operation. In addition, the transistor requires a high-concentration buried layer, a collector epitaxial layer, and a deep trench isolation, etc. Consequently, the number of process steps increases and thus does the costs. On the other hand, the lateral bipolar transistor is simpler in structure than the vertical bipolar transistor. Also, in a lateral bipolar transistor, a collector electrode can be directly brought into contact with a collector region, which is advantageous for high-speed operation.

SUMMARY

In an aspect of the disclosure, a structure comprises: an extrinsic base region within a semiconductor substrate material; a shallow trench isolation structure extending into the semiconductor substrate material and bounding the extrinsic base region; an emitter region adjacent to the shallow trench isolation structure and on a side of the extrinsic base region; and a collector region adjacent to the shallow trench isolation structure and on an opposing side of the extrinsic base region.

In an aspect of the disclosure, a structure comprises: a shallow trench isolation structure extending into a semiconductor substrate; an extrinsic base region within the semiconductor substrate material and extending below the shallow trench isolation structure; an emitter region extending below the shallow trench isolation structure and contacting the extrinsic base region; and a collector region extending to below the shallow trench isolation structure and contacting the extrinsic base region.

In an aspect of the disclosure, a method comprises: forming an extrinsic base region within a semiconductor substrate material; forming a shallow trench isolation structure extending into the semiconductor substrate material and bounding the extrinsic base region; forming an emitter region adjacent to the shallow trench isolation structure and on a side of the extrinsic base region; and forming a collector region adjacent to the shallow trench isolation structure and on an opposing side of the extrinsic base region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to lateral bipolar transistors and methods of manufacture. More specifically, the present disclosure relates to a lateral bipolar transistor with both the collector region and emitter region extending within a semiconductor substrate below shallow trench isolation structures. Advantageously, the lateral bipolar transistor provides for high voltage RF device applications (e.g., low noise amplifiers and power amplifiers), with additional benefits of improved linearity for Wi-Fi applications.

In embodiments, the lateral bipolar transistor comprises an extrinsic base region bounded by shallow trench isolation structures in a semiconductor substrate. An emitter region and a collector region are adjacent to the shallow trench isolation structures on opposing sides of the extrinsic base region. The emitter region and collector region extend deeper in the semiconductor substrate than the shallow trench isolation structures. A well is provided underneath the extrinsic base region and extends below the shallow trench isolation strictures. The well and the emitter region define a first p-n junction underneath the shallow trench isolation structure. Similarly, the well and the collector region define a second p-n junction underneath the shallow trench isolation structure. A deep well may be provided underneath the emitter region, the collector region and the well, with the extrinsic base electrically coupled with the deep well.

The lateral bipolar transistors of the present disclosure can be manufactured in a number of ways using a number of different tools. In general, though, the methodologies and tools are used to form structures with dimensions in the micrometer and nanometer scale. The methodologies, i.e., technologies, employed to manufacture the lateral bipolar transistors of the present disclosure have been adopted from integrated circuit (IC) technology. For example, the structures are built on wafers and are realized in films of material patterned by photolithographic processes on the top of a wafer. In particular, the fabrication of the lateral bipolar transistors uses three basic building blocks: (i) deposition of thin films of material on a substrate, (ii) applying a patterned mask on top of the films by photolithographic imaging, and (iii) etching the films selectively to the mask.

Figure 1:
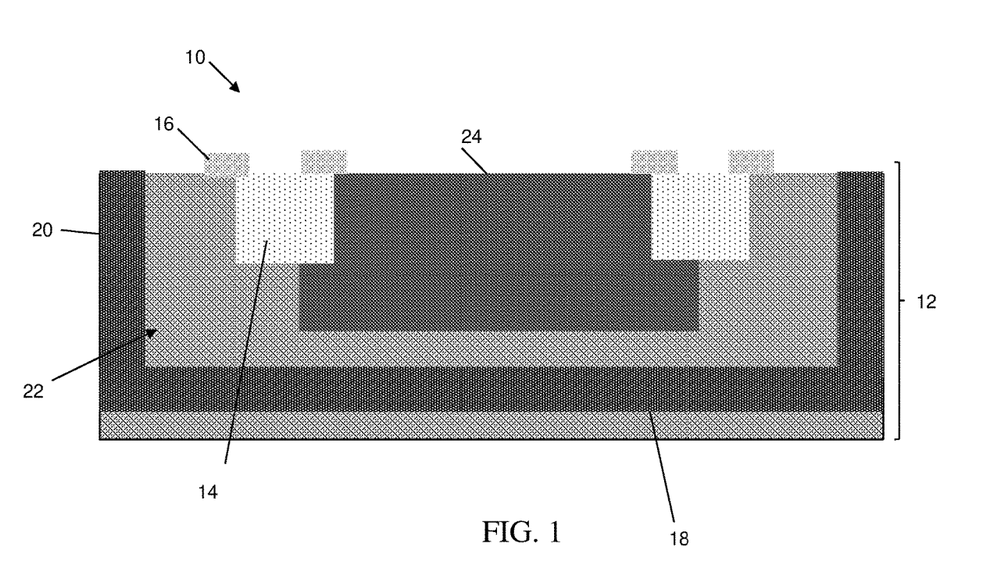
FIG. 1 shows a substrate with shallow trench isolation structures, amongst other features, and respective fabrication processes in accordance with aspects of the present disclosure.

FIG. 1 shows a substrate with shallow trench isolation structures, amongst other features, and respective fabrication processes. In particular, the structure 10 of FIG. 1 includes a semiconductor substrate 12 comprising any suitable semiconductor material including, but not limited to, Si, SiGe, SiGeC, SiC, GaAs, InAs, InP, and other III/V or II/VI compound semiconductors. In a preferred embodiment, the semiconductor substrate 12 comprises a P+Si bulk substrate. In further embodiments, the semiconductor substrate 12 comprises a single crystallographic orientation (e.g., a (100), (110), (111), or (001) crystallographic orientation).

Still referring to FIG. 1, shallow trench isolation structures 14 are formed within the semiconductor substrate 12. In embodiments, the shallow trench isolation structures 14 may be used to isolate the lateral bipolar transistor from other devices, as an example. The shallow trench isolation structures 14 can be formed by conventional lithography, etching and deposition methods known to those of skill in the art. For example, a resist formed over the semiconductor substrate 12 is exposed to energy (light) to form a pattern (opening). An etching process with a selective chemistry, e.g., reactive ion etching (RIE), will be used to form one or more trenches in the semiconductor substrate 12 through the openings of the resist. Following the resist removal by a conventional oxygen ashing process or other known stripants, insulator material (e.g., $SiO_2$) can be deposited within the trenches by any conventional deposition process, e.g., chemical vapor deposition (CVD) processes. Any residual insulator material on the surface of the semiconductor substrate 12 may be removed by conventional chemical mechanical polishing (CMP) processes.

FIG. 1 further shows dummy gate structures 16 at edges of the shallow trench isolation structures 14. The dummy gate structures 16 may be used to support a smaller Rx width. By way of an illustrative, non-limiting example, the dummy gate structures 16 may be fabricated from a polysilicon material using conventional blanket deposition processes, followed by a patterning process, e.g., lithography and etching processes known in the art.

A deep N-well implant region 18 and n-well implant regions 20 connecting to the deep N-well implant 18 may be provided within the semiconductor substrate 12. As should be recognized, the deep N-well implant region 18 and the n-well implant regions 20 may form an isolation region 22 within the semiconductor substrate 12, which may be used to isolate a lateral bipolar transistor from other devices. A p-well region 24 may also be formed in the semiconductor substrate 12 between the shallow trench isolation structures 14.

In embodiments, the N-well implant region 18, the n-well implant regions 20 and the p-well region 24 may be fabricated by conventional ion implantation processes known to those of skill in the art. For example, the N-well implant region 18 and the n-well implant regions 20 may be formed with different dopant concentrations and/or implant energies using n-type dopants implanted within the semiconductor substrate 12. The n-type dopants may be, e.g., Arsenic (As), Phosphorus (P) and Sb, among other suitable examples. In contrast, the p-well region 24 may be formed with p-type dopants, e.g., Boron. The p-well region 24 may form part of an extrinsic base of the lateral bipolar transistor as described further herein.

By way of more specific example, the wells 18, 20, 24 may be formed by introducing a dopant by, for example, ion implantation that introduces a concentration of the particular dopant in the semiconductor substrate 12. The wells 18, 20 may be formed by introducing different ion implant energies and/or dopant concentrations; whereas the well 24 may be formed by introducing a different dopant type. In embodiments, respective patterned implantation masks may be used to define selected areas exposed for the implantations. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions.

Figure 2:
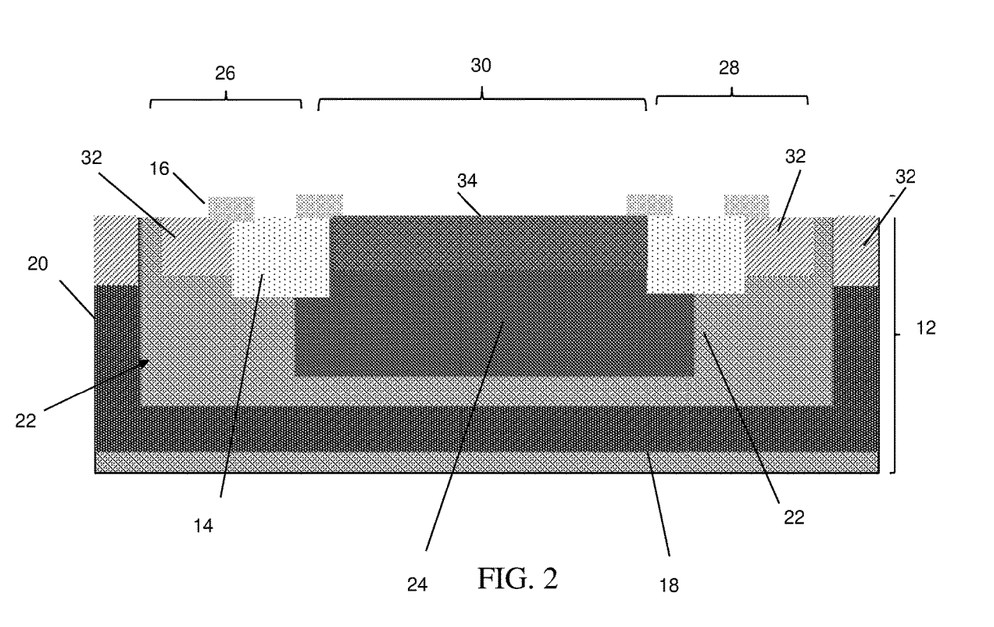
FIG. 2 shows partial formation of an emitter region and a collector region, on opposing sides of an extrinsic base region, amongst other features, and respective fabrication processes in accordance with aspects of the present disclosure.

FIG. 2 shows partial formation of an emitter region 26 and a collector region 28, on opposing sides of an extrinsic base region 30. In embodiments, the emitter region 26 and the collector region 28 include an N+ implant region 32 and the extrinsic base region 30 includes a P+ implant region 34 in the p-well 24 (between the shallow trench isolation structures 14). The N+ implant regions 32 may also be formed at an upper portion of the n-well implant regions 20.

As should be understood by those of skill in the art, the N+ implant regions 32 of the emitter region 26 and the collector region 28 may be formed using a patterned implantation mask which comprises an opening between edges of the shallow trench isolation structures 14 and the n-well implant regions 20. Similarly, the P+ implant region 34 of the extrinsic base region 30 may be formed using a patterned implantation mask which comprises an opening aligning with the p-well region 24, between the shallow trench isolation structures 14. The profile, e.g., depth, of the well implant regions 32, 34 may be controlled by an ion implant energy as is known in the art. In embodiments, the depth of the well implant regions 32 should preferably be above a bottom surface of the shallow trench isolation structures 14.

Figure 3:
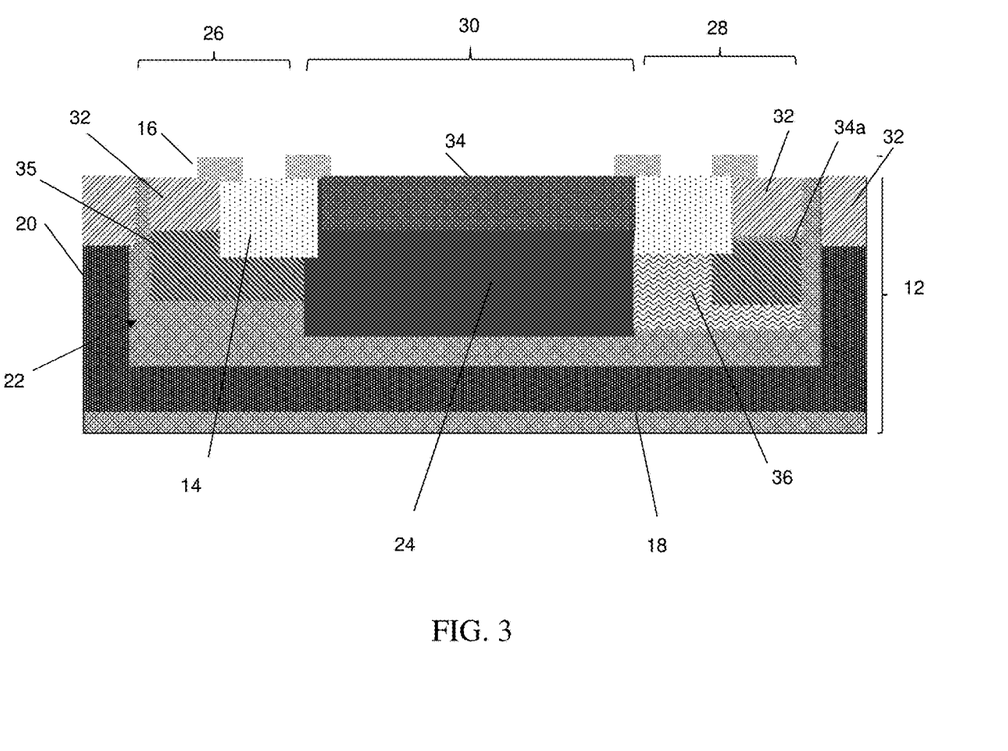
FIG. 3 shows the extrinsic base region, the collector region, and the emitter region, amongst other features, amongst other features, and respective fabrication processes in accordance with aspects of the present disclosure.

In FIG. 3, additional implants are provided in the emitter region 26 and the collector region 28. In particular, deeper N+ implant regions 35, 34a may be provided in the emitter region 26 and the collector region 28. In embodiments, the deeper N+ implant regions 35, 34a may extend underneath the respective N-implant regions 32 to below the bottom surface of the shallow trench isolation structures 14. In further embodiments, the N+ implant region 35 extends underneath the shallow trench isolation region 14 and makes physical contact with the p-well region 24 of the extrinsic base region 30. In this way, a p-n junction is formed underneath the shallow trench isolation structure 14 between the emitter region 26 and extrinsic base region 30.

In contrast, in the collector region 28, the N+ implant region 34a does not make direct physical contact with the p-well region 24 of the extrinsic base region 30; instead, a lightly doped N− region 36, e.g., As, may be provided under the N+ implant region 34a to make contact between the N+ implant region 32 and the p-well region 24 of the extrinsic base region 30. In this way, a p-n junction may be formed underneath the shallow trench isolation structure 14 between the collector region 28 and extrinsic base region 30.

As with the formation of any of the wells described herein, a patterned implantation mask may be used to define selected areas exposed for the implantations. In this case, the implantation mask used to form the lightly doped N− region 36 may have an opening extending from an outer edge of the N+implant region 34a to within the p-well region 24 of the extrinsic base region 30, with an ion implant energy such that the lightly doped N−implant region 36 extends below the shallow trench isolation structures 14. It should also be understood by those of skill in the art that an anneal process may be used to drive in the implants into the semiconductor substrate 12 as is known in the art such that no further explanation is required for a complete understanding of the present disclosure.

Figure 4:
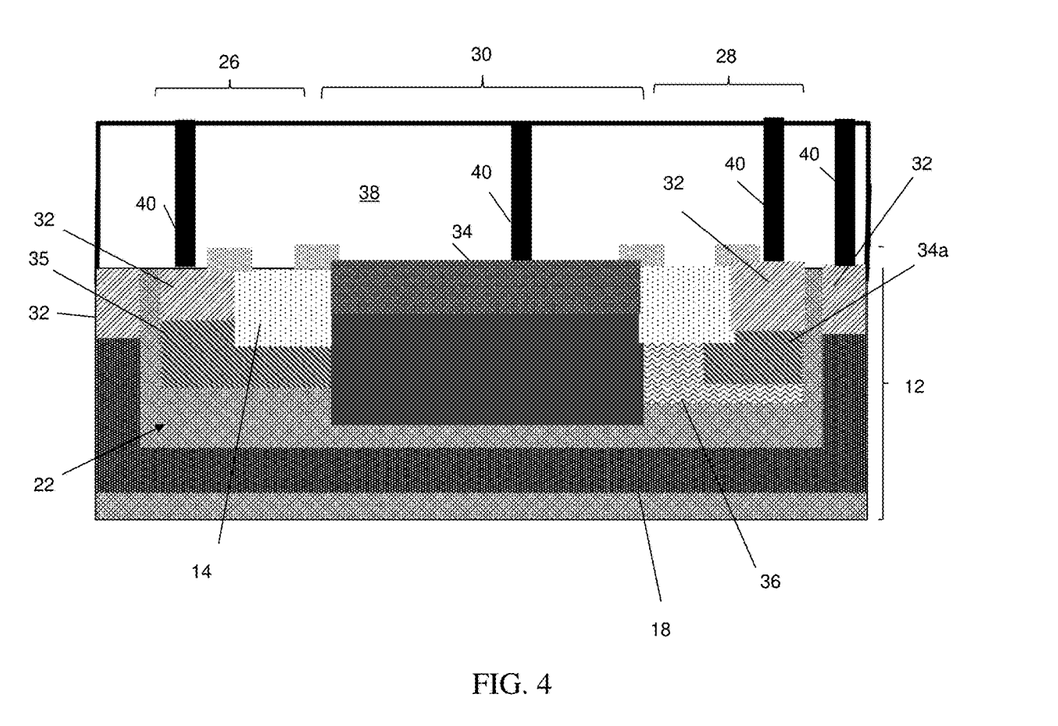
FIG. 4 shows contacts to the extrinsic base region, the collector region, and the emitter region, amongst other features, and respective fabrication processes in accordance with aspects of the present disclosure.

Referring to FIG. 4, contacts 40 are provided to the well regions 32, 34 for the emitter region 26, the collector region 28 and the extrinsic base region 30. The contacts 40 may also be provided to the n-well implant region 20 (through well 34) on the collector side of the device. Prior to forming the contacts 40, a silicide may be formed over wells 32, 34. As should be understood by those of skill in the art, the silicide process begins with deposition of a thin transition metal layer, e.g., nickel, cobalt or titanium, over the wells 32, 34. After deposition of the material, the structure is heated allowing the transition metal to react with exposed silicon (or other semiconductor material as described herein) in the active regions of the semiconductor device forming a low-resistance transition metal silicide. Following the reaction, any remaining transition metal is removed by chemical etching, leaving silicide contacts in the active regions of the device.

Contacts 40 may be formed on the silicide contacts. In embodiments, the contacts 40 may be tungsten or aluminum formed by conventional lithography, etching and deposition processes. For example, an interlevel dielectric material or stack of materials 38 may be deposited over the structure, followed by via formation to expose the underlying silicide contacts. The vias may be formed conventional lithography and etching processes. A conductive material, e.g., tungsten or aluminum, may be deposited within the vias to form the contacts 40. Any residual material on the interlevel dielectric material 38 may be removed by a CMP process.

Figure 5:
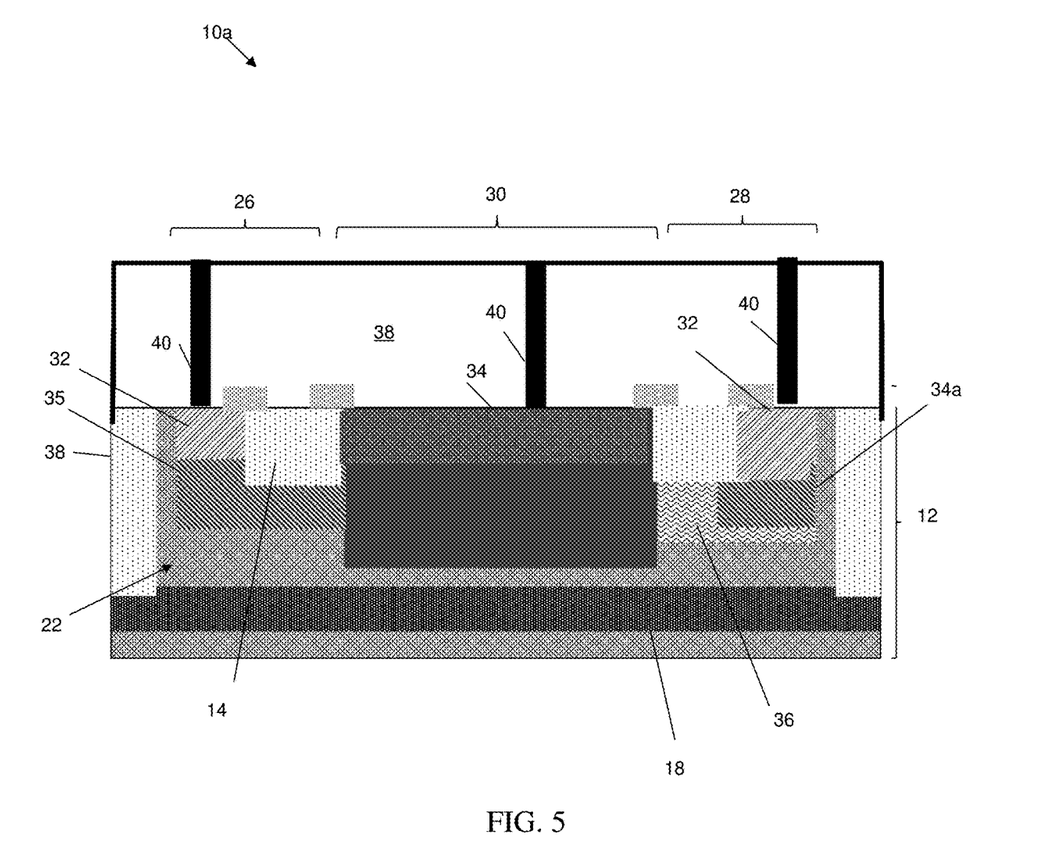
FIGS. 5 and 6 show alternative lateral bipolar transistors and respective fabrication processes in accordance with aspects of the present disclosure.

FIG. 5 shows an alternative structure 10a in accordance with aspects of the present disclosure. In this structure 10a, the n-well implant regions 20 shown in FIGS. 1-4 may be replaced with deep trench isolation structures (e.g., filled with an insulator material such as an oxide) 38. In embodiments, the deep trench isolation structures 38 in combination with the deep n-well region 18 will isolate the lateral bipolar transistor. The deep trench isolation structures 38 may be formed by conventional lithography, etching and deposition processes, similar to that described with respect to the shallow trench isolation structures 14 of FIG. 1.

Figure 6:
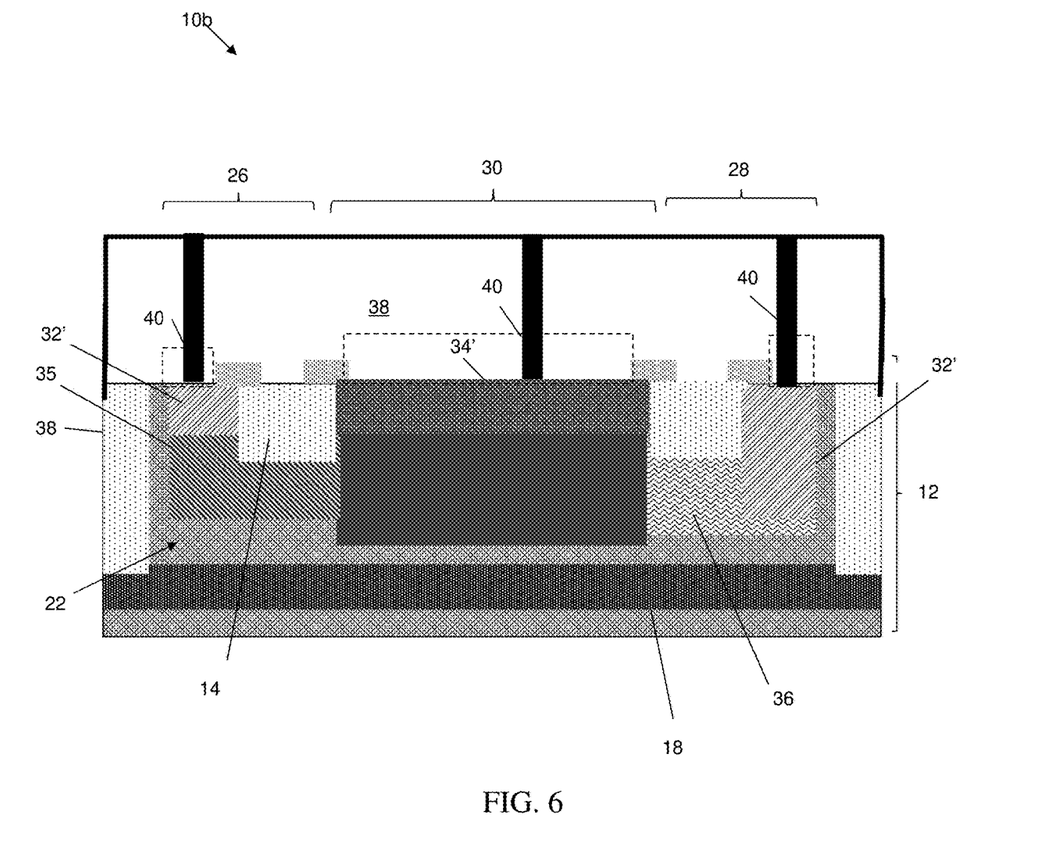

FIG. 6 shows an alternative structure 10b in accordance with aspects of the present disclosure. In this structure 10b, the well implant regions 32, 34 may be replaced with an epitaxial semiconductor material 32' 34'. In embodiments, the epitaxial semiconductor material 32' may be Si doped with an n-type dopant and the epitaxial semiconductor material 34' may be SiGe material doped with a p-type dopant, both of which will provide lower resistance characteristics than the wells shown in FIG. 5.

In embodiments, the epitaxial semiconductor material 32' 34' may be fabricated by forming a trench within the semiconductor substate 12 by conventional lithography and etching processes, followed by a conventional epitaxial growth process with an in-situ doping process. It should also be understood by those of skill in the art that the use of SiGe material for the extrinsic base region 30 may be used to form a lateral heterojunction bipolar transistor.

In embodiments, the epitaxial semiconductor material 32', 34' may also be used to form a raised emitter region 26, a raised collector region 28 and a raised extrinsic base region 30 as shown by the dashed lines in FIG. 6. In still further embodiments, the epitaxial semiconductor material 34' may be replaced with a Ge condensation process for forming of the extrinsic base region 30. Moreover, the structure 10b may utilize either the deep trench isolation structures 38 as described in FIG. 5 or the n-well implant regions 20 as described in FIGS. 1-4.

The transistor can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
an extrinsic base region comprising a P+ region within a p-well in a semiconductor substrate material;
a shallow trench isolation structure extending into the semiconductor substrate material and bounding the extrinsic base region;
an emitter region adjacent to the shallow trench isolation structure and on a side of the extrinsic base region, the emitter region comprising an N+ region isolated and separated from the P+ region of the extrinsic base region by the shallow trench isolation structure;
a collector region adjacent to the shallow trench isolation structure and on an opposing side of the extrinsic base region;
an isolation region within the semiconductor substrate material, the isolation region comprising an n-well region surrounding the extrinsic base region comprising the P+ region, the p-well, the emitter region comprising the N+ region, and the collector region;
a deep n-well extending underneath the isolation region, the extrinsic base region, the emitter region and the collector region, the deep n-well directly contacting the isolation region that extends to a surface of the semiconductor substrate material, and the deep n-well is on sides and surrounds the extrinsic base region, the emitter region and the collector region; and
a contact directly connecting to n-wells which are contacting the deep n-well,
wherein the collector region comprises an N+ implant region, an N+ well region deeper than the N+ implant region and an N-well, each of which directly contact the shallow trench isolation structure, the N-well and the N+ well region extend underneath the shallow trench isolation structure and the N-well extends to and directly contacts a sidewall of the p-well of the extrinsic base.

2. The structure of claim 1, wherein the extrinsic base region comprises a p-well region extending below the shallow trench isolation structure.

3. The structure of claim 2, wherein the emitter region comprises an n-well region extending underneath the shallow trench isolation structure which contacts the p-well region.

4. The structure of claim 3, wherein a p-n junction is at an interface of the n-well region contacting the p-well region between the extrinsic base region and the emitter region.

5. The structure of claim 1, wherein a p-n junction is at an interface of the N-well region contacting the p-well region between the extrinsic base region and the collector region.

6. The structure of claim 1, wherein the emitter region and the collector region comprise doped epitaxial semiconductor material adjacent to the shallow trench isolation structure.

7. The structure of claim 6, wherein adoped epitaxial semiconductor material of the extrinsic base region comprises P+ doped SiGe material.

8. The structure of claim 6, wherein the extrinsic base region, the emitter region and the collector region comprise a raised extrinsic base region, a raised emitter region and a raised collector region, respectively.

9. A structure comprising:
a shallow trench isolation structure extending into a semiconductor substrate;
an extrinsic base region comprising a P+ region within a p-well in the semiconductor substrate and extending to below the shallow trench isolation structure;
an emitter region extending below the shallow trench isolation structure and contacting the extrinsic base region, the emitter region comprising an N+ region isolated and separated from the P+ region of the extrinsic base region by the shallow trench isolation structure;
a collector region extending below the shallow trench isolation structure and contacting the extrinsic base region;
an isolation region within the semiconductor substrate, the isolation region comprising an n-well region surrounding the extrinsic base region comprising the P+ region, the p-well, the emitter region comprising the N+ region, and the collector region;
a deep n-well extending underneath the isolation region, the extrinsic base region, the emitter region and the collector region, the deep n-well directly contacting the isolation region that extends to a surface of the semiconductor substrate, and the deep n-well is on sides and surrounds the extrinsic base region, the emitter region and the collector region; and
a contact directly connecting to n-wells which are contacting the deep n-well,
wherein the collector region comprises an N+ implant region, an N+ well region deeper than the N+ implant region and an N-well, each of which directly contact the shallow trench isolation structure, the N-well and the N+ well region extend underneath the shallow trench isolation structure and the N-well extends to and directly contacts a sidewall of the p-well of the extrinsic base.

10. The structure of claim 9, wherein the extrinsic base region is bounded by the shallow trench isolation structure.

11. The structure of claim 10, wherein the emitter region is on a first side of the extrinsic base region adjacent to the shallow trench isolation structure and the collector region is on a second side of the extrinsic base region adjacent to the shallow trench isolation structure.

12. The structure of claim 11, wherein the emitter region comprises an N+ well implant region extending underneath the shallow trench isolation structure, the extrinsic base region comprises a p-well extending below a surface of the shallow trench isolation structure, and an interface of the N+ well implant region and the p-well comprises a p-n junction under the shallow trench isolation structure.

13. The structure of claim 9, wherein the emitter region and the collector region comprise epitaxial semiconductor material adjacent to the shallow trench isolation structure, and the epitaxial semiconductor material of the extrinsic base region comprises SiGe.

14. A method comprising:
forming an extrinsic base region comprising a P+ region within a p-well in a semiconductor substrate material;
forming a shallow trench isolation structure extending into the semiconductor substrate material and bounding the extrinsic base region;
forming an emitter region adjacent to the shallow trench isolation structure and on a side of the extrinsic base region, the emitter region comprising an N+ region isolated and separated from the P+ region of the extrinsic base region by the shallow trench isolation structure;
forming a collector region adjacent to the shallow trench isolation structure and on an opposing side of the extrinsic base region;
forming an isolation region within the semiconductor substrate material, the isolation region comprising an n-well region surrounding the extrinsic base region comprising the P+ region, the p-well, the emitter region comprising the N+ region, and the collector region;
forming a deep n-well extending underneath the isolation region, the extrinsic base region, the emitter region and the collector region, the deep n-well directly contacting the isolation region that extends to a surface of the semiconductor substrate material and the deep n-well, and is on sides and surrounds the extrinsic base region, the emitter region and the collector region; and
forming a contact directly connecting to n-wells which is contacting the deep n-well,
wherein the collector region comprises an N+ implant region, an N+ well region deeper than the N+ implant region and an N-well, each of which directly contact the shallow trench isolation structure, the N-well and the N+ well region extend underneath the shallow trench isolation structure and the N-well extending to and directly contacting a sidewall of the p-well of the extrinsic base.

* * * * *